United States Patent

Takeshima et al.

[11] Patent Number: 6,064,597
[45] Date of Patent: May 16, 2000

[54] METHOD OF PROGRAMMING A MULTILEVEL NONVOLATILE MEMORY CELL WITH REDUCED NUMBER OF ERASE OPERATIONS

[75] Inventors: Toshio Takeshima; Hiroshi Sugawara, both of Tokyo, Japan

[73] Assignee: NEC Corporation, Tokyo, Japan

[21] Appl. No.: 08/943,589

[22] Filed: Oct. 3, 1997

[30] Foreign Application Priority Data

Oct. 3, 1996 [JP] Japan .................................. 8-263326

[51] Int. Cl.⁷ ........................................... G11C 16/04
[52] U.S. Cl. .............................. 365/185.24; 365/185.29
[58] Field of Search ........................ 365/185.29, 185.18, 365/185.3, 185.28, 185.03, 185.24

[56] References Cited

U.S. PATENT DOCUMENTS

| | | | |
|---|---|---|---|
| 5,487,033 | 1/1996 | Keeney et al. | 365/185.19 |
| 5,535,158 | 7/1996 | Yamagata | 365/185.29 |
| 5,544,119 | 8/1996 | Wells et al. | 365/185.11 |
| 5,553,020 | 9/1996 | Keeney et al. | 365/185.19 |
| 5,563,822 | 10/1996 | Yiu et al. | 365/185.14 |
| 5,615,148 | 3/1997 | Yamamura et al. | 365/185.11 |
| 5,739,568 | 4/1998 | Kojima | 257/316 |
| 5,748,530 | 5/1998 | Gotou et al. | 365/185.18 |
| 5,774,397 | 6/1998 | Endoh et al. | 365/185.19 |
| 5,801,989 | 9/1998 | Lee et al. | 365/185.22 |
| 5,828,600 | 10/1998 | Kato et al. | 165/185.11 |

*Primary Examiner*—David Nelms
*Assistant Examiner*—Hien Nguyen
*Attorney, Agent, or Firm*—Young & Thompson

[57] ABSTRACT

In order to reduce the number of erase operations of a nonvolatile memory cell which stores a threshold voltage selected from among a plurality of threshold levels, a plurality of programming operations are implemented before an erase operation. That is, the programming operations are executed which respectively vary the threshold voltage of the memory cell to a different one of the plurality of threshold levels, or retain the previously stored threshold voltage of the memory cell. Thereafter, the memory cell is erased so as to return the voltage which is stored in the memory cell to a predetermined level, in response to all of the threshold levels having been used in the programming operations.

11 Claims, 11 Drawing Sheets

METHOD OF PROGRAMMING A MULTILEVEL NONVOLATILE MEMORY CELL WITH REDUCED NUMBER OF ERASE OPERATIONS

BACKGROUND OF THE INVENTION

1. Field of the Invention

The present invention relates generally to a method of programming a multilevel nonvolatile memory cell which reduces the number of erase operations. More specifically the present invention relates to a method of consecutively programming a multilevel nonvolatile memory cell without a cell erase operation. The nonvolatile memory cell is typically a flash memory cell.

2. Description of the Related Art

Nonvolatile semiconductor memories use a variety of semiconductor memory cells designs. One type of nonvolatile memory cells uses an electrically isolated floating gate to trap charge. Such a type memory cell is referred to as a flash memory cell.

Flash memory is a new variation of a programmable nonvolatile memory, which is gaining favor because they can be erased and programmed (or reprogrammed) faster than the existing EPROMs (erasable programmable read-only memories), and because they use a simpler storage cell, thereby allowing more memory cells on a single chip. Further, in order to improve cost performance per transistor cell, it has been proposed for one cell to store more than two pieces of information (viz., more than one bit).

Figure 1:
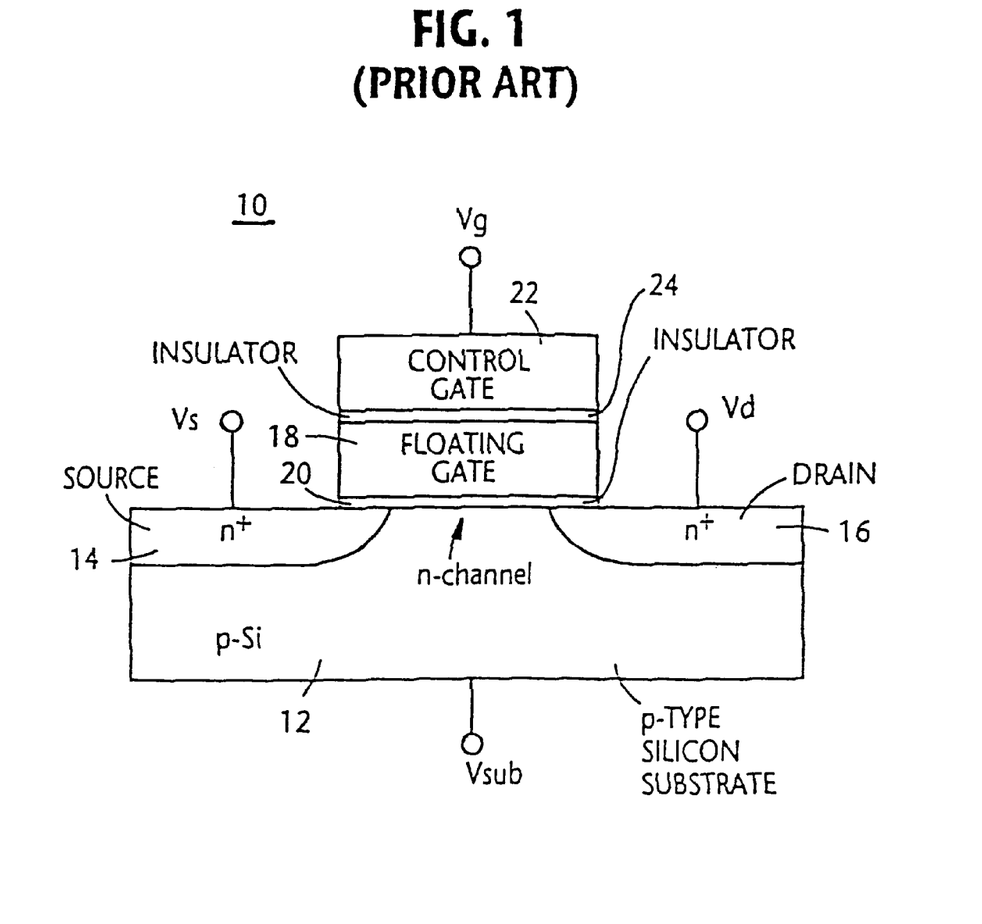
FIG. 1 is a schematic cross-sectional view of a conventional transistor memory cell forming part of a flash memory, referred to the opening paragraphs of the instant disclosure.
Figure 3:
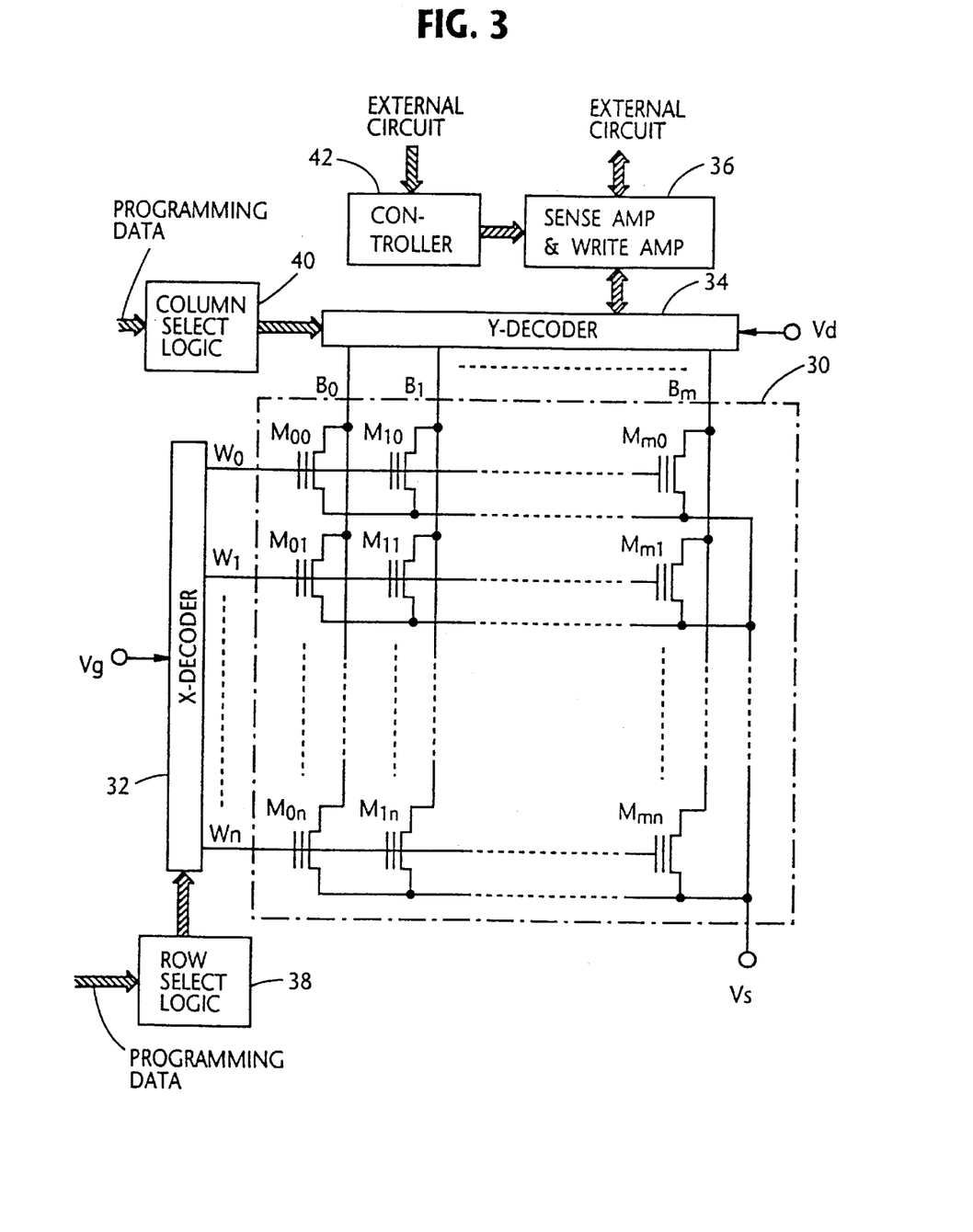
FIG. 3 is a diagram schematically depicting a manner wherein a flash memory includes a matrix array of transistor memory cells and a plurality of associated functional blocks, and which is provided to give a better understanding of the present invention.

As is known in the art, a flash memory Is provided with a matrix array of one-transistor cells, each having a structure of the nature shown in FIG. 1, and which are arranged in rows and columns (as best illustrated in FIG. 3).

Figure 2A:
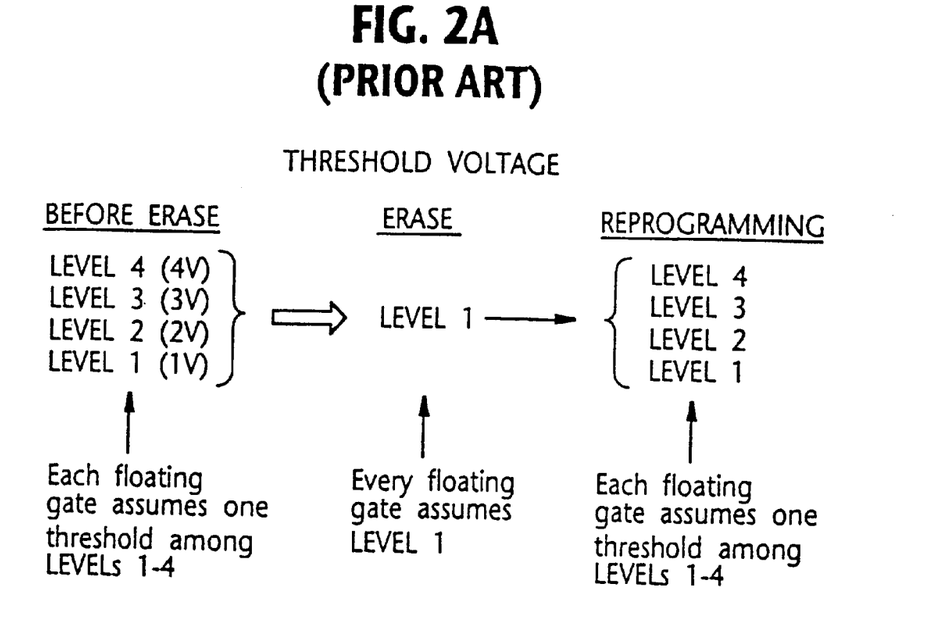
FIGS. 2A and 2B are each a diagram depicting the change of threshold voltage of a floating gate of FIG. 1.
Figure 2B:
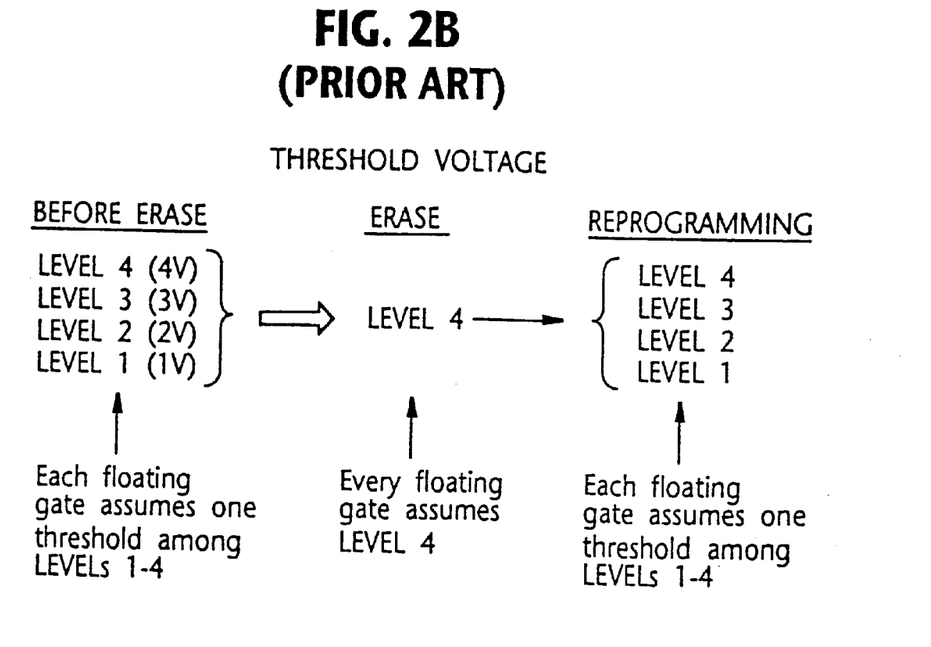

Prior to turning to the present invention it is deemed preferable to describe, with reference to FIGS. 1, 2A and 2B, a conventional flash memory and programming or reprogramming techniques.

In FIG. 1, a single transistor cell (depicted by numeral 10) is schematically shown in cross-section. The transistor cell 10 comprises a p-type silicon substrate 12 that carries, on the upper portion thereof, two n$^+$ regions: one of which functions as a source 14 and the other of which acts as a drain 16. An n-channel is thus formed between the source 14 and the drain 16. A poly-silicon (for example) floating gate 18 is provided over the n channel via an insulation layer (silicon-dioxide layer (for example)) 20 (about 10 nm in thickness (for example)). A control gate 22 is situated over the floating gate 18 via another insulation layer 24 (about 25 nm (for example)). As is known in the art, electron tunneling can be used both to inject charge and to pull charge off the floating gate 18, while hot electron injection is another mechanism for inserting charge into the floating gate 18. Notations Vs, Vd, Vg and Vsub in FIG. 1 respectively designate voltage terminals that are coupled, via appropriate metal contacts (not shown), to the source 14, the drain 16, the gate 22, and the silicon substrate 12, With a transistor cell storing only two values (viz., one bit), the threshold voltage of the cell is defined as the voltage on the floating gate 18 that is required to turn the transistor on. However, with a multilevel type transistor cell, the floating gate is selectively charged to one among a plurality of threshold voltages while programming or reprogramming. That is to say, the threshold voltages, depending on the respective values, determine the amount of currents each of which flows through the channel between the source and drain. The current is then converted to a corresponding voltage which is compared with an associated reference voltage, whereby the cell is capable of storing more than one bit.

Reference is made to FIG. 2A, which is a diagram describing one example of erase and reprogramming operations of the transistor cell shown in FIG. 1. It is assumed that the floating gate 18 (FIG. 1) has one of four threshold levels 1, 2, 3 and 4 that respectively correspond to 1 V, 2 V, 3 V and 4 V (merely by way of example). It is to be noted that each of the threshold levels 1, 2, 3 and 4 is with a predetermined range of voltages for each state, and thus, the above-mentioned concrete values of 1 V, 2 V, 3 V and 4 V are exemplary.

Prior to reprogramming, the cell is erased by bringing the voltage of the floating gate 18 to the lowest level (viz., LEVEL 1) irrespective of the previous threshold level. After completing the erase operation, the cell is reprogrammed to one of the threshold levels. In this case, If there is no need to change the first threshold voltage (LEVEL 1) of the floating gate 18, the reprogramming operation is not required.

On the other hand, another way to erase the cell is shown in FIG. 2B wherein the voltage of the floating gate 18 is set to the highest level (viz., LEVEL 4).

With both the cases shown in FIGS. 2A and 2B, it is understood that the erasing operation is absolutely necessary before each reprogramming.

During the erase operation, a high electric filed strength is developed in the insulation layer 20 in order to impel electrons already injected into the floating gate 18 (as in the case shown in FIG. 2A), or in order to inject electrons to raise the potential of the gate 18 (as in the case shown in FIG. 2B). As a result, the layer 20 is undesirably subjected to electric stress each time the erasing is performed. That is, the repeatedly applied electric stress prior to each programming leads to the deterioration of the cell's performance characteristics and further, results in shortening the longevity of memory cell. Further, the time period necessary for erasing is much larger than that for programming, which undesirably lowers the operation speed of flash memory.

It is therefore highly preferable that a plurality of consecutive programming operations can be carried out with the very minimum of erasing operations.

SUMMARY OF THE INVENTION

It is therefore an object of the present to provide a method of programming a nonvolatile memory cell which reduces the number of erasing operations involved therein.

Another object of the present invention is to provide a method of programming a nonvolatile memory cell wherein at least one erasing operation between two consecutive cell programming operations can be omitted.

In brief, these objects are achieved by a method wherein, in order to reduce the number of erase operations of a nonvolatile memory cell which stores a threshold voltage selected from among a plurality of threshold levels, a plurality of programming operations are implemented before an erase operation. That is, the programming operations are executed which respectively vary the threshold voltage of the memory cell to a different one of the plurality of threshold levels, or retain the previously stored threshold voltage of the memory cell. Thereafter, the memory cell is erased so as to return the voltage which is stored in the memory cell to a predetermined level, in response to all of the threshold levels having been used in the programming operations.

One aspect of the present invention resides in a method of programming a multilevel nonvolatile memory cell which stores a threshold voltage selected from among a plurality of threshold levels, comprising the steps of: executing programming operations which respectively vary the threshold voltage of the memory cell to a different one of the plurality of threshold levels, or retain the threshold voltage of the memory cell; and erasing the memory cell and returning the voltage which is stored in the memory cell to a predetermined level, in response to all of the threshold levels having been used in the programming operations.

Another aspect of the present invention resides in a method of programming a multilevel nonvolatile memory cell which stores a threshold voltage selected from among a plurality of threshold levels, comprising the steps of: (a) determining the threshold voltage currently stored in the memory cell; (b) executing a programming operation which, based on the threshold voltage determined at step (a), verifying the threshold voltage of the memory cell to a different one of the plurality of threshold levels or retaining the threshold voltage of the memory cell; (c) repeating steps (a) and (b) until all of the threshold levels have been used in the programming operations; and (d) erasing the memory cell and returning the voltage of the memory cell to a predetermined level.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

Reference is made to FIG. 3, which is presented for a better understanding of a flash memory which comprises a matrix array of one-transistor cells such as shown in FIG. 1. Since the arrangement of FIG. 3 is well known in the art, only a brief description thereof will be given. In the following, the voltage terminals Vg, Vd and Vs referred to in connection with FIG. 1 are used to designate the voltages applied thereto for the sake of simplifying the disclosure.

In FIG. 3, a memory array 30 is formed by transistor cells $M_{00}$ to $M_{mm}$, an X-decoder (or row decoder) 32, an Y-decoder (or column decoder) 34, and a combination of sense and write amplifiers 36. The X-decoder 32 is supplied with a control gate voltage Vg and has word lines $W_0$ to $W_n$ respectively extending to the rows of the transistor cells 30. The Y-decoder 34 is supplied with the drain voltage Vd and has bit lines $B_0$ to $B_m$ respectively extending to the columns of the cells. Each bit line is connected to the drain electrodes of the cells of the corresponding column, and each word line is connected to the gate electrodes of the cells of the corresponding row. The source electrodes of all transistor cells are connected to receive the source voltage Vs. The substrate electrode Vsub is not shown in FIG. 4 thus simplifying the drawing.

Address data for selecting one or more transistor cells is supplied to a row select logic 38 and a column select logic 40. The row select logic 38 is connected to the X-decoder 32 to select one or more word lines, while the column select logic 40 is connected to the Y-decoder 34 to select one or more bit lines.

A controller 42 is provided to control the read and write operations, which are pertinent to the embodiments of the present Invention and which will be described later.

With a conventional multilevel type nonvolatile memory cell, the cell is programmed to one of the total possible threshold voltages at each programming. Taking a concrete example, if the memory cell has fourteen (14) threshold levels, and the cell is programmed to one of the fourteen levels, then the cell must be erased before the subsequent programming.

However, according to the present invention, the cell is programmed to one of a given number of the total available levels. Therefore, it is possible to implement a plurality of programming operations before erasure of the memory cell is necessary.

First Embodiment

Figure 4:
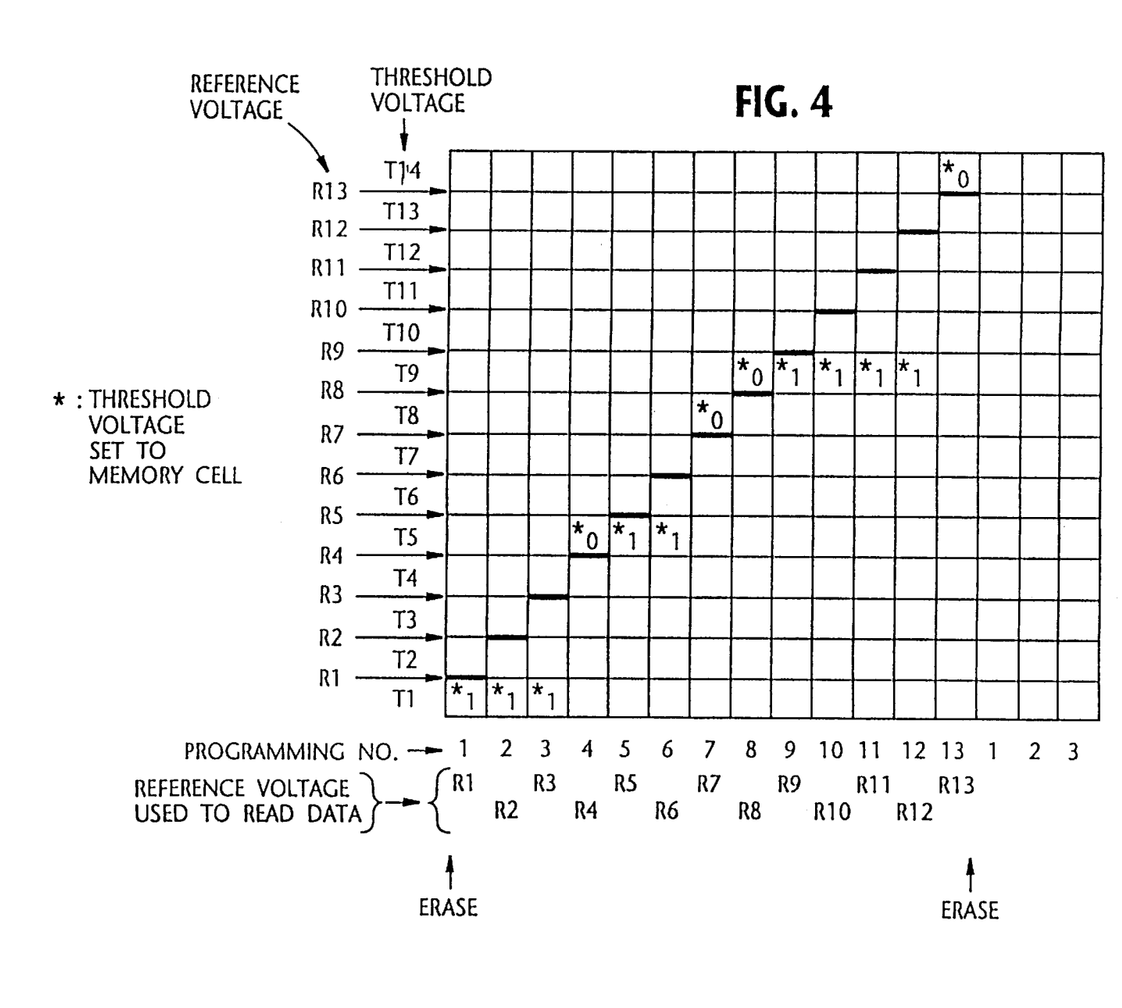
FIGS. 4, 5 and 6 are each a diagram showing the manner wherein a memory cell is programmed according to a first embodiment of the present invention.

FIG. 4 is a diagram showing a manner of how, at each programming, one of two logic states "0" and "1" is stored in a memory cell. Logic state "0" or "1" is defined by determining if the threshold voltage stored in the cell is higher or lower than an associated reference voltage.

It is to be noted that the memory cell is fabricated such as to have fourteen threshold voltages in this particular case. When a logic state of the memory cell is to be determined, the threshold voltage stored in the cell is read out using the sense amplifier 36 (FIG. 3) and then Is compared, at the controller (FIG. 3), with an associated reference voltage(s) selected from among R1–R13. The programming is performed using the write amplifier 36 (FIG. 3) under control of the controller 42.

As mentioned above, the memory cell stores one of two logic states "0" and "1" in this case. Thus, the number of programming operations becomes thirteen. The memory cell is erased before the first programming operation as indicated in FIG. 4. When the erasing is implemented, the memory cell is set to the threshold voltage T1. At the first programming, if the cell is to be set to logic state "1", no programming is implemented and thus, the threshold voltage T1 is retained. Notation "*" indicates that the threshold voltage listed at the corresponding left side is set to the memory cell.

Prior to the second programming, the controller 42 determines the current logical state of the cell by comparing the threshold voltage T1 with the reference voltage R1. Then, at the second programming, if the cell is to hold logic state "1", the controller 42 ascertains that there is no need for programming the cell and thus, the threshold voltage T1 is held in the cell.

Likewise, prior to the third programming, the controller 42 determines the current logical state of the cell by comparing the threshold voltage T1 with the reference voltage R2. At the third programming, if the cell is to be still set to logic "1", the controller 42 determines that there is no need for programming the cell. Thus, the threshold voltage T1 is held in the cell as well.

Following this, as In the above, prior to the fourth programming, the controller 42 determines that the current status of the cell that it is still held at logic state "1". At the fourth programming, if the cell is to be set to logic state "0", the controller 42 controls the write amplifier 36 such as to program the cell to the threshold voltage T5. Since the controller 42 counts the number of programming operations, it is possible to program the cell to the threshold voltage T5.

In a similar manner, prior to the fifth programming, the controller 42 compares the threshold voltage T5 with the reference voltage R4 and ascertains that the current status of the cell is at logic state "0". At the fifth programming, if the cell is to be set to logic state "1", the controller 42 retains the status of the cell.

The subsequent sixth to thirteenth operations will be clearly understood from the foregoing and thus, no further description thereof will be given for the sake of brevity.

When the number of programmings reaches thirteen, the cell is erased before the next new programming cycle. Since the controller 42 is previously aware of the number of programming operations, the above mentioned entrance to the new cycle can be implemented without difficulty.

In the programming operation discussed with reference to FIG. 1, the range of selectable threshold voltages is (T1, T2), (T2, T3), . . . , (T12, T13) and (T13, T14). Therefore, the above mentioned range from the second can generally be represented by (aM−(a−1)) to ((a+1)M−a) where M denotes the number of available logic states and a=1, 2, 3, 4, . . . This is applicable to the following cases.

Figure 5:
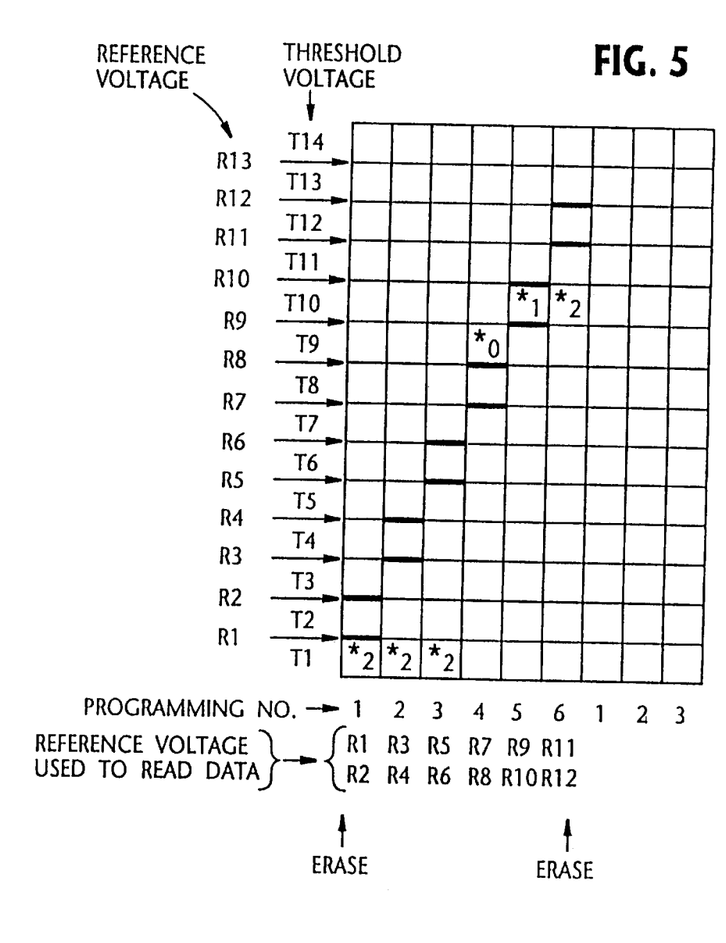

FIG. 5 is a diagram showing a manner wherein the memory cell is programmed, at each programming, to one of three logic states "0", "1" and "2". Logic states "0", "1" and "2" are defined by comparing the threshold voltage stored in the cell with a maximum of two associated reference voltages as stated hereinafter.

As mentioned above, it is assumed that the memory cell is fabricated such as to have fourteen threshold voltages. However, the highest threshold voltage T14 is not used in this particular case.

Since the memory cell stores one of three logic states "0", "1" and "2", the number of programming operations becomes six. The memory cell is erased before the first programming operation as indicated in FIG. 5. Although not shown in FIG. 5, when the erasing is implemented, the memory cell is set to the threshold voltage T1. At the first programming, if the cell is to be set to the lowest logic state "2", no programming is implemented and thus, the threshold voltage T1 is retained.

Prior to the second programming, the controller 42 determines the current logical state of the cell by comparing the threshold voltage T1 set to the memory cell with the reference voltage R1. In this case, logic state "2" is ascertained by the above comparison and thus, it is not necessary to further compare the stored threshold voltage with the reference voltage R2. Then, at the second programming, if the cell is to hold logic "2", the controller 42 ascertains that there is no need for programming the cell and thus, the threshold voltage T1 is held in the cell.

Likewise, prior to the third programming, the controller 42 is able to determine the current logical state of the cell by comparing the threshold voltage T1 with the reference voltage R3. At the third programming, since the cell has stored logic state "2", if the cell is to be set to logic "2" as well, the controller 42 determines that there is no need for programming the cell. Thus, the threshold voltage T1 is held in the cell.

Following this, as in the above, prior to the fourth programming, the controller 42 determines that the current status of the cell is still held at logic state "2". At the fourth programming, if the cell is to be set to logic "0", the controller 42 controls the write amplifier 36 such as to program the cell to the threshold voltage T9. Since the controller 42 counts the number of programming operations, it is possible to program the cell to the threshold voltage T9.

In a similar manner, prior to the fifth programming, the controller 42 compares the threshold voltage T9 with the reference voltage R7 and ascertains that the current status of the cell is at either logic state "0" or "1". Therefore, the controller 42 further compares the threshold voltage T9 with the reference voltage R8 and determines that the current logic status is "0". At the fifth programming, if the cell is to be set to logic state "1", the controller 42 sets the cell to the threshold voltage T10.

Finally, prior to the sixth programming, the controller 42 compares the threshold voltage T10 with the reference voltage R9 and ascertains that the current status of the cell is at either logic state "0" or "1". Therefore, the controller 42 further compares the threshold voltage T10 with the reference voltage R10 and determines that the current logic status is "1". At the sixth programming, if the cell is to be set to logic state "2", the controller 42 allows the cell to retain the threshold voltage T10 which means logic state "2" at the instant programming.

At the sixth programming, the available upper threshold level reaches the maximum threshold level T13 and thus, before next programming, the cell is erased under control of the controller 42.

Figure 6:
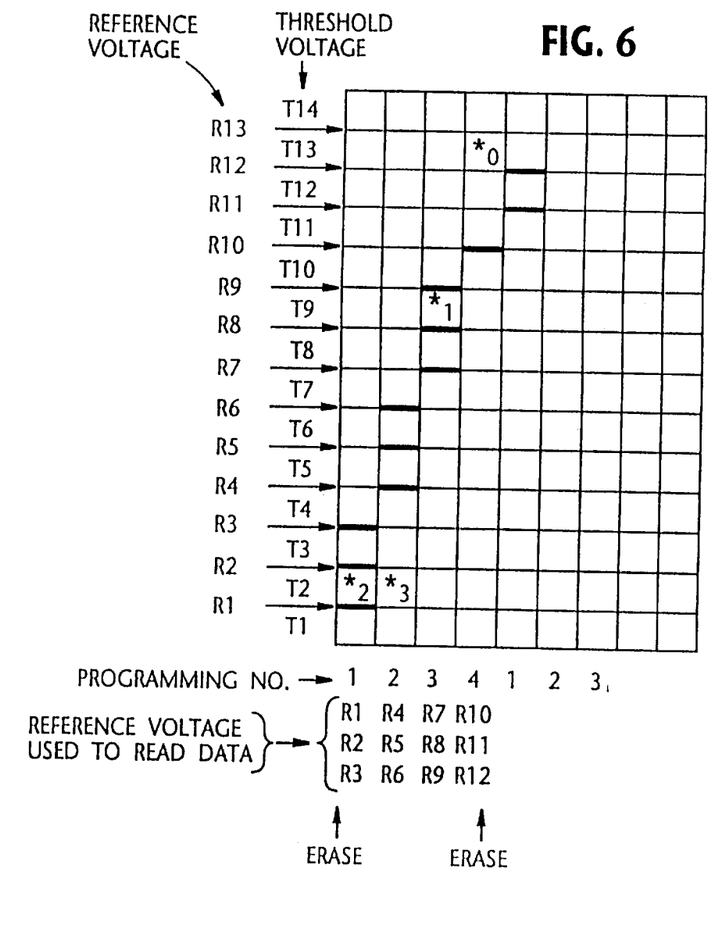

FIG. 6 is a diagram showing a manner wherein the memory cell is programmed, at each programming, to one of four logic states "0", "1", "2" and "3". Logic states "1", "0", "1", "2" and "3" are defined by comparing the threshold voltage stored in the cell with a maximum of three associated reference voltages.

As mentioned above, the memory cell is fabricated such as to have fourteen threshold voltages. However, the highest threshold voltage T14 is not used in this case.

The memory cell stores one of four logic states "0", "1", "2" and "3" in this case. Thus, the number of programming operations becomes four. The memory cell is erased before the first programming operation as indicated in FIG. 6. Although not shown in FIG. 6, when the erasing is implemented, the memory cell is set to the threshold voltage T1. At the first programming, if the cell is to be set to the lowest logic state "2", no programming is implemented and thus, the threshold voltage T1 is retained. The remaining operations of the case shown in FIG. 6 will readily be understood from the foregoing and accordingly, further description thereof will be omitted for simplifying the disclosure.

Second Embodiment

The second embodiment of the present invention will be described with reference to FIGS. 7–9. According to the second embodiment, if the memory cell is found to have stored the lowest logic state at the previous programming, and if the memory cell is also to store the lowest logic state, then the controller 42 raises the threshold voltage to the uppermost level that indicates the lowest logic state.

Figure 7:
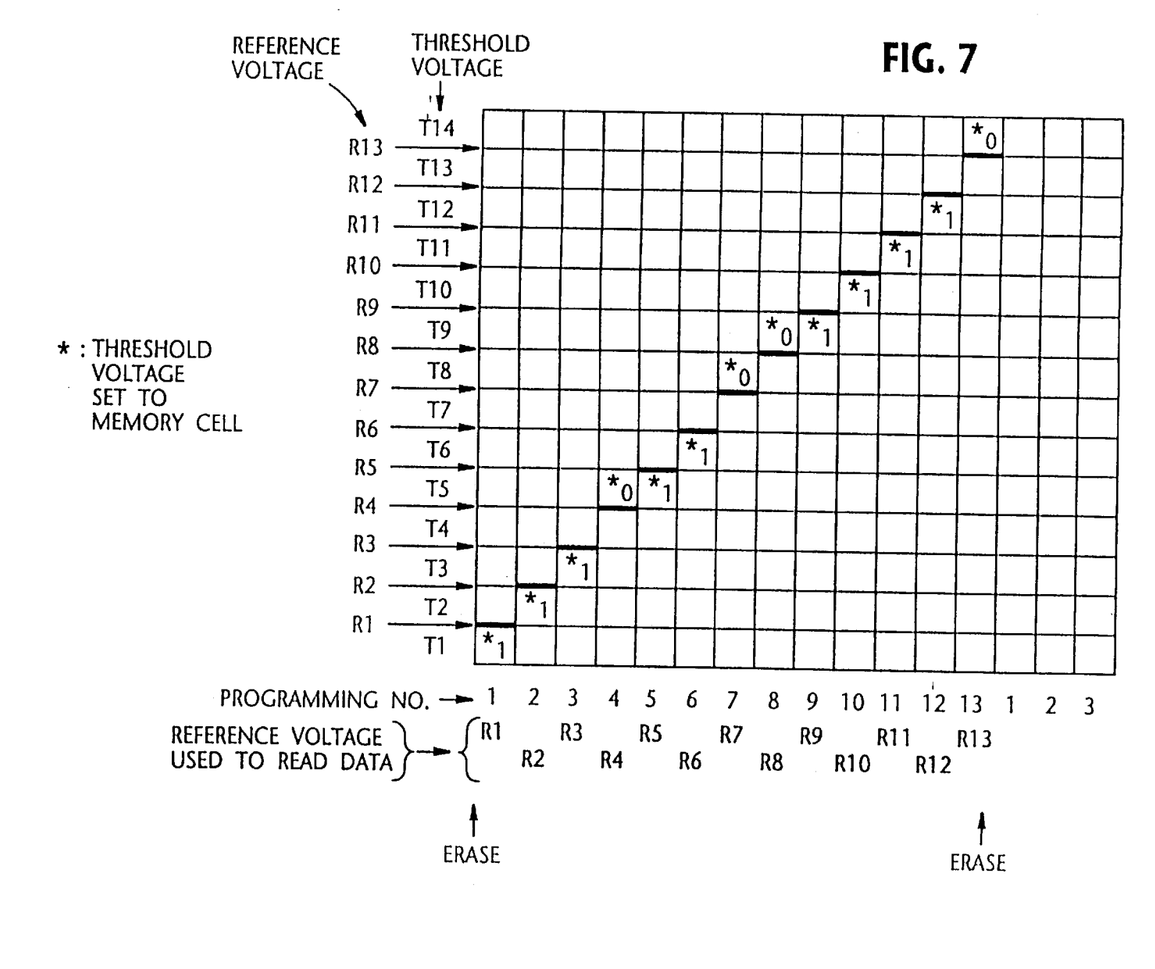
FIGS. 7, 8 and 9 are each a diagram showing the manner wherein a memory cell is programmed according to a second embodiment of the present invention.

FIG. 7 is a diagram showing a manner wherein the cell is programmed, at each programming, to one of two logic states "0" and "1". The case shown in FIG. 7 corresponds to that of FIG. 4. As in the first embodiment, logic states "0" and "1" are respectively defined when the threshold voltage stored in the cell are higher and lower than an associated reference voltage. The memory cell is fabricated such as to have fourteen threshold voltages in this particular case.

As mentioned above, the memory cell stores one of two logic states "0" and "1" in this case. Thus, the number of programming operations becomes thirteen. The memory cell is erased before the first programming operation as indicated in FIG. 7. When the erasing is implemented, the memory cell is set to the threshold voltage T1. At the first programming, if the cell is to be set to logic state "1", no programming is implemented and thus, the threshold voltage T1 is retained.

Prior to the second programming, the controller 42 determines the current logical state of the cell by comparing the threshold voltage T1 with the reference voltage R1. Then, at the second programming, if the cell is to hold logic "1", the controller 42 shifts the threshold voltage T1 to T2, which is different from the first embodiment.

Likewise, prior to the third programming, the controller 42 determines the current logical state of the cell by comparing the threshold voltage T1 with the reference voltage R2. At the third programming, if the cell is to be still set to logic "1", the controller 42 shifts the threshold voltage T2 to T3.

The subsequent operations will be clearly understood from the foregoing and no further description will not be given for the sake of brevity.

Figure 8:
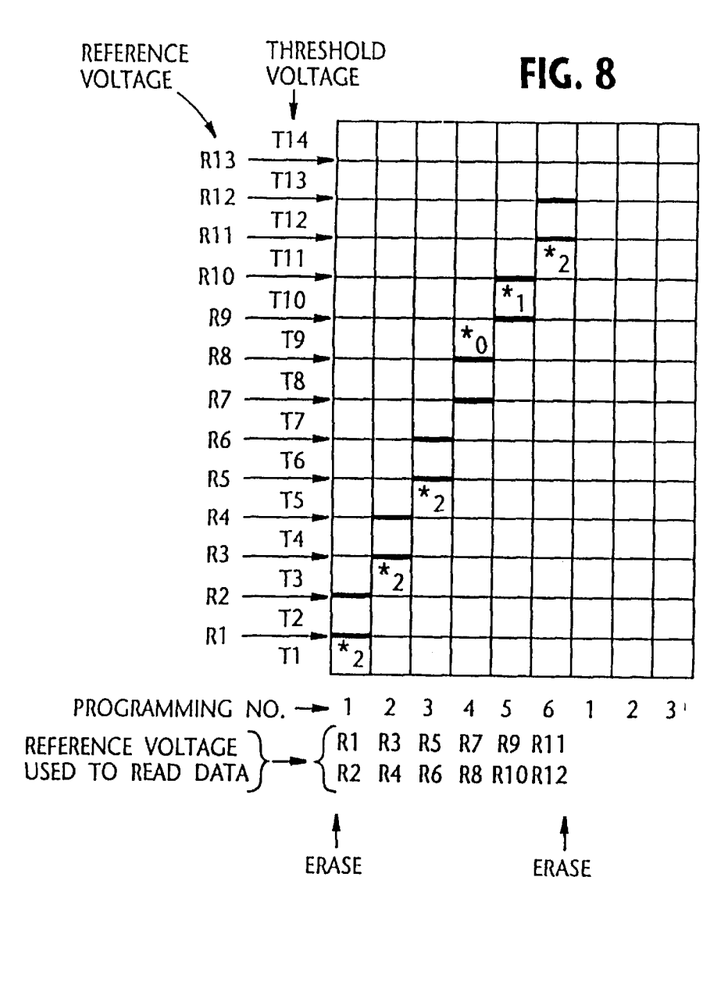
Figure 9:
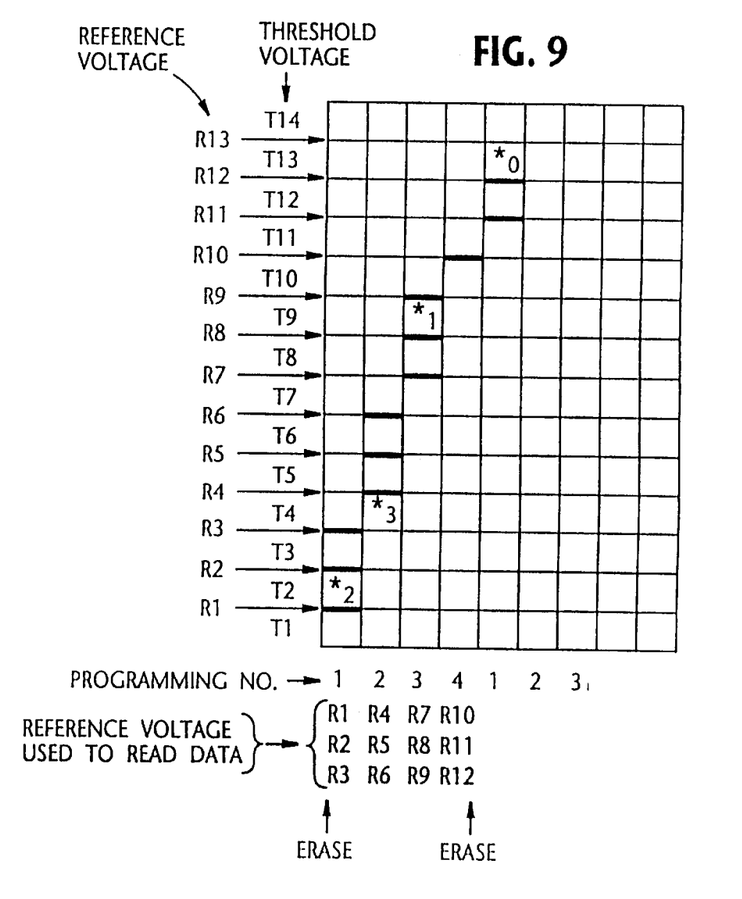

The cases shown in FIGS. 8 and 9 in accordance of the second embodiment correspond receptively to those shown in FIGS. 5 and 6. The operations of the cases shown in FIGS. 8 and 9 will be also readily understandable from the preceding discussion and therefore will be omitted fore brevity.

One advantage of the second embodiment is that when logic state "1" is changed to logic state "0" (as shown in FIG. 4), an abrupt voltage change can be avoided. This is applicable to the case where logic state "2" (FIG. 5) or "3" (FIG. 6) is changed to logic state "0".

Third Embodiment

Figure 10:
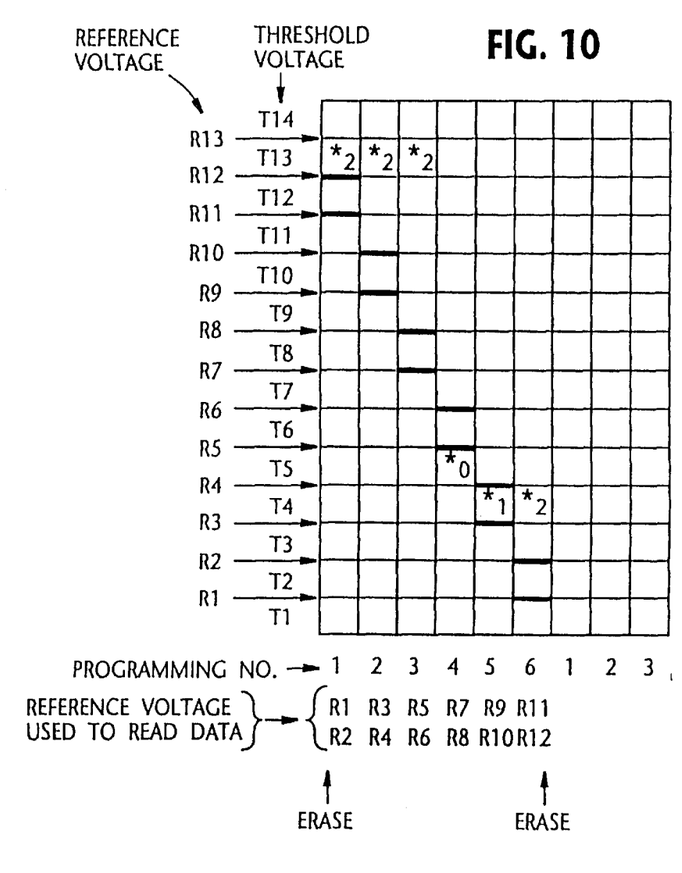
FIG. 10 is a diagram showing the manner wherein a memory cell is programmed according to a third embodiment of the present invention.

The third embodiment of the present invention will be described with reference to FIG. 10. The case shown in FIG. 10 corresponds to that of FIG. 5 of the first embodiment. As in the above cases, the memory cell is fabricated such as to have fourteen threshold voltages. However, the highest threshold voltage T14 is not used in this case.

According to the third embodiment, when the memory cell is erased, the cell assumes the available highest threshold voltage T13 which is assigned to logic state "2". Thereafter, as the programming proceeds, the threshold voltages are lowered to indicate logic states "2", "1" or "0". It is to be noted that logic state "0" is represented by the threshold voltage lower than "2" and "1". Other than this, the case shown in FIG. 10 is similar to that shown in FIG. 5. Further operation of the instant case can be understood without any difficulty and thus, further discussion will be omitted.

Fourth Embodiment

Figure 11:
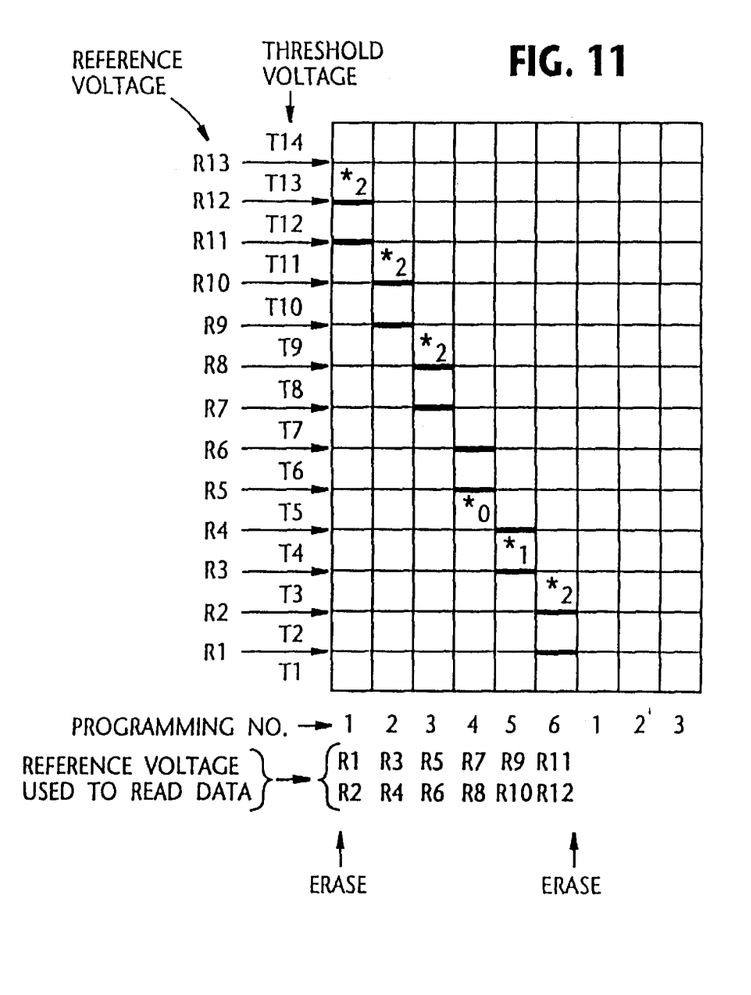
FIG. 11 is a diagram showing the manner wherein a memory cell is programmed according to a fourth embodiment of the present invention.

The fourth embodiment of the present invention will be described with reference to FIG. 11. The case shown in FIG. 11 corresponds to that of FIG. 8 of the second embodiment.

The fourth embodiment, if the memory cell is found to have stored the highest logic state at the previous programming, and if the memory cell is also to store the highest logic state, then the controller 42 lowers the threshold voltage to the lowermost level that indicates the highest logic state.

It will be understood that the above disclosure is representative of only four possible embodiments of the present invention and that the concept on which the invention is based is not specifically limited thereto.

What is claimed is:

1. A method of programming a multilevel nonvolatile memory cell which stores a threshold voltage selected from among a plurality of threshold levels, comprising the steps of:

executing programming operations which respectively vary the threshold voltage of the memory cell to a different one of the plurality of threshold levels, or retain the threshold voltage of the memory cell; and erasing the memory cell and returning the threshold voltage which is stored in the memory cell to a predetermined level, in response to all of the threshold levels having been used in the programming operations.

2. A method as claimed in claim 1, wherein at each of the programming operations, the threshold voltage currently stored in the memory cell is determined before varying or retaining the threshold voltage of the memory cell.

3. A method as claimed in claim 1, wherein the predetermined level is the lowest level of the plurality of threshold levels.

4. A method as claimed in claim 1, wherein the predetermined level is the highest level of the plurality of threshold levels.

5. A method of programming a multilevel nonvolatile memory cell which stores a threshold voltage selected from among a plurality of threshold levels, comprising the steps of:

(a) determining the threshold voltage currently stored in the memory cell;

(b) executing a programming operation which, based on the threshold voltage determined at step (a), varies the threshold voltage of the memory cell to a different one of the plurality of threshold levels or retains the threshold voltage of the memory cell;

(c) repeating steps (a) and (b) until all of the threshold levels has been used in the programming operations; and (d) erasing the memory cell and returning the threshold voltage of the memory cell to a predetermined level.

6. A method as claimed in claim 5, wherein the predetermined level is the lowest level of the plurality of threshold levels.

7. A method as claimed in claim 5, wherein the predetermined level is the highest level of the plurality of threshold levels.

8. A method of programming a multilevel nonvolatile memory cell which stores a threshold voltage selected from among a plurality of threshold levels, comprising the steps of:

executing programming operations which respectively vary the threshold voltage of the memory cell to a different one of the plurality of threshold levels, or retain the threshold voltage of the memory cell; and erasing the memory cell and returning the threshold voltage which is stored in the memory cell to a predetermined level, in response to all of the threshold levels having been used in the programming operations, wherein the predetermined level is one of the lowest level and the highest level of the plurality of threshold levels.

9. A method as claimed in claim 8, wherein the predetermined level is the lowest level of the plurality of threshold levels.

10. A method as claimed in claim 8, wherein the predetermined level is the highest level of the plurality of threshold levels.

11. A method as claimed in claim 8, wherein at each of the programming operations, the threshold voltage currently stored in the memory cell is determined before varying or retaining the threshold voltage of the memory cell.

* * * * *